(12) United States Patent
Ishizaki

(10) Patent No.: US 7,664,908 B2
(45) Date of Patent: Feb. 16, 2010

(54) SEMICONDUCTOR MEMORY DEVICE AND OPERATING METHOD OF THE SAME

(75) Inventor: Tatsuya Ishizaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 211 days.

(21) Appl. No.: 11/133,265

(22) Filed: May 20, 2005

(65) Prior Publication Data

US 2005/0265088 A1    Dec. 1, 2005

(30) Foreign Application Priority Data

May 26, 2004    (JP)    ............................. 2004-156506

(51) Int. Cl.
  *G11C 7/10*    (2006.01)
  *G11C 8/00*    (2006.01)
  *G06F 13/00*    (2006.01)
  *G06F 13/28*    (2006.01)

(52) U.S. Cl. .................. 711/105; 710/35; 365/189.05; 365/230.08

(58) Field of Classification Search .................. None
  See application file for complete search history.

(56) References Cited

U.S. PATENT DOCUMENTS 6,640,267 B1 * 10/2003 Raza ........................... 710/38

2003/0146950 A1 * 8/2003 Miyo et al. .................. 347/19

FOREIGN PATENT DOCUMENTS

JP    P2003-7060 A    1/2003

* cited by examiner

*Primary Examiner*—Christian P Chace
*Assistant Examiner*—Gary W Cygiel
(74) *Attorney, Agent, or Firm*—Foley & Lardner LLP

(57) ABSTRACT

A semiconductor memory device adapted to burst transmission is provided for improving flexibility of data write operation. The semiconductor memory device is composed of a memory array, a set of write registers, and an input buffer designed to sequentially receive a series of write data during a burst cycle, and to write the write data into the associated write registers. The device also includes a write release register containing a set of write release flags associated with the write registers, respectively, and a write release register controller asserting the associated write release flags in response to the write data being written into the associated write registers. The device also contains a write amplifier designed to concurrently write the write data contained in the write registers associated with the asserted write release flags, selectively, when the burst cycle is aborted in response to a control signal.

3 Claims, 14 Drawing Sheets

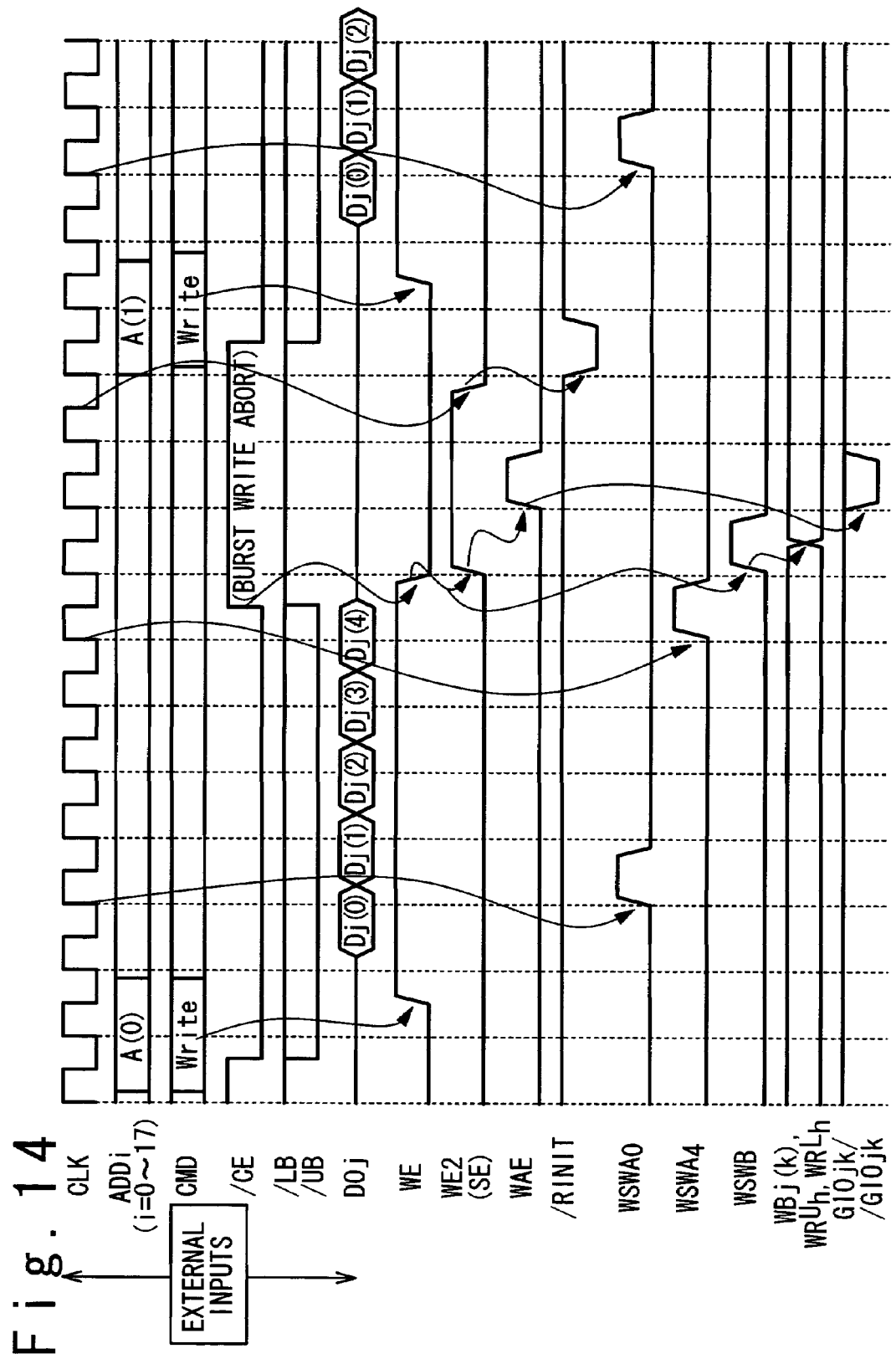

SEMICONDUCTOR MEMORY DEVICE AND OPERATING METHOD OF THE SAME

BACKGROUND OF THE INVENTION

1. Field of the Invention

The present invention relates to semiconductor memory devices and method of operating the same, and more particularly, relates to semiconductor memory devices adapted to burst transmission.

2. Description of the Related Art

The Static Random Access Memory (SRAM) is a typical semiconductor memory device used as a work memory for data processing. Using an SRAM as a working memory effectively achieves high speed data processing due to the enhanced operation speed.

The SRAM, however, often dissatisfies recent requirements of electronic devices due to the poor integration capability. Recent high-end electronic devices require a work memory having an increased capacity, and an SRAM may dissatisfy a required specification as a work memory. This necessitates an alternative semiconductor memory with an increased capacity, suitable as a work memory.

The pseudo SRAM is a semiconductor memory device satisfying such requirement. The pseudo SRAM designates a sort of dynamic random access memory (DRAM) with an external interface compatible with the SRAM. The pseudo SRAM, composed of DRAM memory cells suitable for high integration, can be used as a work memory with an increased capacity, providing the compatibility with the SRAM.

One drawback is that the pseudo SRAM suffers from the reduced access speed to the memory array, compared to the SRAM. This results from the fact that the access speed of DRAM cells within the pseudo SRAM is not as high as that of SRAM cells. Therefore, the improvement of the access speed is one of the most important issues for using a pseudo SRAM as a work memory.

Burst transmission is one known technique for improving the access speed of the pseudo SRAM. The burst transmission designates a technique for enhancing the transmission speed through successively transmitting read/write data associated with a series of addresses. The COSMORAM (Common Specifications for Mobile RAM) standard, which has been recently proposed for defining the functions of the pseudo SRAM interface, supports the burst transmission. Hereinafter, write operation based on burst transmission may be referred to as burst write operation, and read operation based on burst transmission may be referred to as burst read operation.

In order to improve the speed of burst write and read operations, pseudo SRAMs adapted to burst transmission often incorporate a set of registers for temporary storing write and read data; a register for storing write data may be referred to as a write register, and a register for storing read data may be referred to as a read register. The write operation of such designed pseudo SRAM involves sequentially storing write data associated with one burst cycle into the write register, and concurrently transferring the complete set of the write data from the write register to the memory array. The read operation, on the other hand, involves concurrently transferring a complete set of desired read data from the memory array to the read register, and sequentially outputting the read data from the read register. The concurrent data transfer between the memory array and the registers effectively reduces the number of accesses to the memory array, and therefore improves the access speed of the pseudo SRAM.

Partially transferring the write data stored in the write register to the memory array is considered as a preferred requirement for improving the flexibility of the burst write operation. Let us suppose a burst write operation sequence with the burst length being eight, which involves sequentially transferring eight data bits through each input/output pin during one burst cycle. In this burst write operation sequence, it would be advantageous for improving the data access flexibility of the memory array, if first to six data bits, for example, can be selectively transferred from the write register to the memory array.

Conventional pseudo SRAMs, however, are not adapted to selective data transfer of write data from the write register to the memory cells; pseudo SRAMs are conventionally designed to concurrently transfer the complete set of the write data. A special architecture is needed for satisfying such requirement.

As disclosed in Japanese Open Laid Patent Application No. P2003-7060A, synchronous DRAMs supporting burst transmission are designed to achieve selective data write into the memory array using the data mask signal (DQM signal).

The selective data write technique based on the data mask signal, however, is not applicable to the pseudo SRAM, because the standard SRAM interface is not adapted to the data mask signal.

SUMMARY OF THE INVENTION

In an aspect of the present invention, a semiconductor memory device is composed of a memory array, a set of write registers, an input buffer, a write release register, a write release register controller, and a write amplifier. The input buffer is designed to sequentially receive a series of write data during a burst cycle, and to write said write data into associated ones of said write registers. The write release register contains a set of write release flags associated with said write registers, respectively. The write release register controller is designed to assert associated ones of said write release flags in response to said write data being written into said associated ones of said write registers. The write amplifier is designed to concurrently write said write data contained in said write registers associated with asserted ones of said write release flags, selectively, when said burst cycle is aborted in response to a control signal.

The semiconductor memory device thus constructed allows the write operation to be aborted in the middle of the burst cycle. In response to the abortion of the write operation being requested, the write amplifier selectively writes the write data stored in the relevant write register into the memory array. The write operation thus described allows the semiconductor memory device to selectively write the desired write data stored in the write registers without a data mask signal. This effectively improves flexibility of burst write operation.

In another aspect of the present invention, a semiconductor memory device is composed of: a memory array; a set of write registers; an input buffer designed to sequentially receive a series of write data during a burst cycle, and to write the write data into associated ones of the write registers; an upper write release register containing a set of upper write release flags associated with the write registers, respectively; a lower write release register containing a set of lower write release flags associated with the write registers, respectively; a write release register controller designed to assert associated ones of the upper write release flags in response to upper bytes of the write data being written into the associated ones of the write registers, and to assert associated ones of the lower write release flags in response to lower bytes of the write data being written into the associated ones of the write registers; and a write amplifier designed to concurrently write the upper bytes of the write data contained in the write registers associated with asserted ones of the upper write release flags, and the lower bytes of the write data contained in the write registers associated with asserted ones of the lower write release flags, selectively, when the burst cycle is aborted in response to a control signal.

In still another aspect of the present invention, a method is provided for operating a semiconductor memory device including a set of write registers and a write release register containing a set of write release flags associated with the write registers, respectively. The method is composed of:

writing write data into associated ones of the write registers during a burst cycle;

asserting the write release flags associated with the write registers into which the write data are written;

inputting a control signal to abort the burst cycle; and concurrently and selectively writing the write data contained in the write registers associated with asserted ones of the write release flags into a memory array, in response to the control signal.

In still another aspect of the present invention, a method is provided for operating a semiconductor memory device including a set of write registers, an upper write release register containing a set of upper write release flags associated with the write registers, respectively. The method is composed of:

a lower write release register containing a set of lower write release flags associated with the write registers, respectively, the method comprising:

enabling selected one(s) of upper and lower bytes of write data;

writing the selected byte(s) of the write data into associated ones of the write registers during a burst cycle;

asserting the upper write release flags associated with the write registers into which the upper byte(s) of the write data are written;

asserting the lower write release flags associated with the write registers into which the lower byte(s) of the write data are written;

inputting a control signal to abort the burst cycle; and concurrently and selectively writing the selected byte(s) of the write data contained in the write registers associated with asserted ones of the upper and lower write release flags into a memory array, in response to the control signal.

BRIEF DESCRIPTION OF THE DRAWINGS

The above and other advantages and features of the present invention will be more apparent from the following description taken in conjunction with the accompanied drawings, in which:

FIG. 14 is a timing chart illustrating an exemplary write operation of the pseudo SRAM shown in FIG. 10.

DESCRIPTION OF THE PREFERRED EMBODIMENTS

Figure 1:
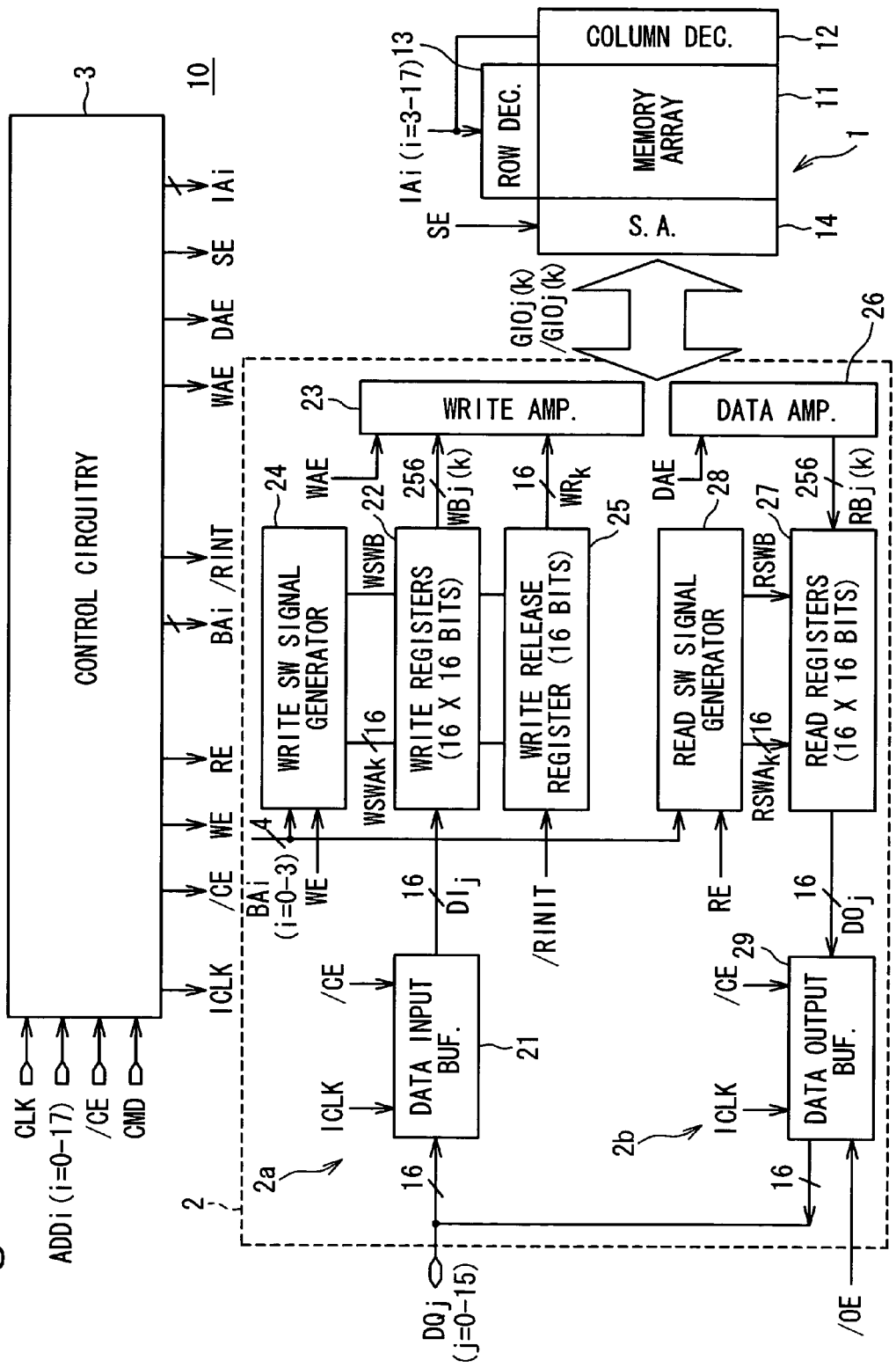
FIG. 1 is a block diagram illustrating a structure of a semiconductor memory device in a first embodiment of the present invention.

The invention will be now described herein with reference to illustrative embodiments. Those skilled in the art would recognize that many alternative embodiments can be accomplished using the teachings of the present invention and that the invention is not limited to the embodiments illustrated for explanatory purposed.

It should be noted that same reference numerals denote same or like elements in the drawings. Subscripts may be attached to the reference numerals if necessary, for distinguishing elements denoted by the same reference numerals.

First Embodiment (Device Structure)

In a first embodiment, a pseudo SRAM 10 is provided with a memory circuitry 1, a data interface circuitry 2, and a control circuitry 3.

The memory circuitry 1 is composed of a memory array 11, a column decoder 12, a row decoder 13, and a sense amplifier circuit 14. The memory array 11 includes DRAM cells arrange in rows and columns (not shown). The column decoder 12, the row decoder 13 and the sense amplifier circuit 14 are used to provide access to a selected memory cell. Specifically, the column decoder 12 selects the column associated with the selected memory cell, and the row decoder 13 selects the row associated with the selected memory cell. The sense amplifier circuit 14 is used for identifying the data stored in the selected memory cell, and for writing desired data into the selected memory cell.

The data interface circuitry 2 provides access to the memory circuitry 1 based on burst transmission. The data interface circuitry 2 is connected to a set of 16 data pins $DQ_0$-$DQ_{15}$ (one shown), providing access between the data pins $DQ_0$-$DQ_{15}$ and the memory array 11. In this embodiment, the data interface circuitry 2 is adapted to burst transmission with the data width being 16 bits, and the maximum burst length being 16 cycles.

The control circuitry 3 is responsive to externally inputted control signals, to develop a set of internal control signals used for controlling the memory circuitry 1 and the data interface circuitry 2. The external control signals include an external clock signal CLK, a set of external address signals $ADD_i$, a chip enable signal /CE, and a command signal CMD. The internal control signals include an internal clock signal ICLK, a chip enable signal /CE, a write enable signal WE, a read enable signal RE, a set of burst address signals $BA_i$, a register initialize signal /RINT, a write amplifier enable signal WAE, a data amplifier enable signal DAE, a sense amplifier enable signal SE, and a set of internal address signals $IA_i$.

It should be noted that a symbol "/" attached to a numeral denoting a signal indicates that the relevant signal is low-active. The fact that the chip enable signal /CE is activated, for example, means that the chip enable signal /CE is pulled down to the "Low" level. Correspondingly, a signal which is not attached with the symbol "/" is high active. The fact that the write enable signal WE is activated, for example, means that the write enable signal WE is pulled up to the "High" level.

The data interface circuitry 2 is composed of a write circuitry 2a and a read circuitry 2b. The write circuitry 2a is used to write data inputted onto the data pins $DQ_0$-$DQ_{15}$ into the memory array 11, and the read circuitry 2b is used to externally output data read from the memory array 11 through the data pins DQ. A detailed explanation is made of the write circuitry 2a and the read circuitry 2b in the following.

(Write Circuitry Structure)

The write circuitry 2a is composed of a data input buffer 21, a set of 16 write registers 22, a write amplifier 23, a write switch signal generator 24, and a write release register 25. It should be noted that the write registers 22 are illustrated as a block in FIG. 1 for simplicity. The number of the write registers 22 is identical to the maximum burst length.

The data input buffer 21 receives externally inputted write data through the data pins DQ in synchronization with the internal clock signal ICLK, and forwards the received write data to the write registers 22. The write data associated with the data pin $DQ_j$ is denoted by the numeral $DI_j$, wherein after. The data input buffer 21 is enabled or disenabled, in response to the chip enable signal /CE received from the control circuitry 3.

Figure 2:
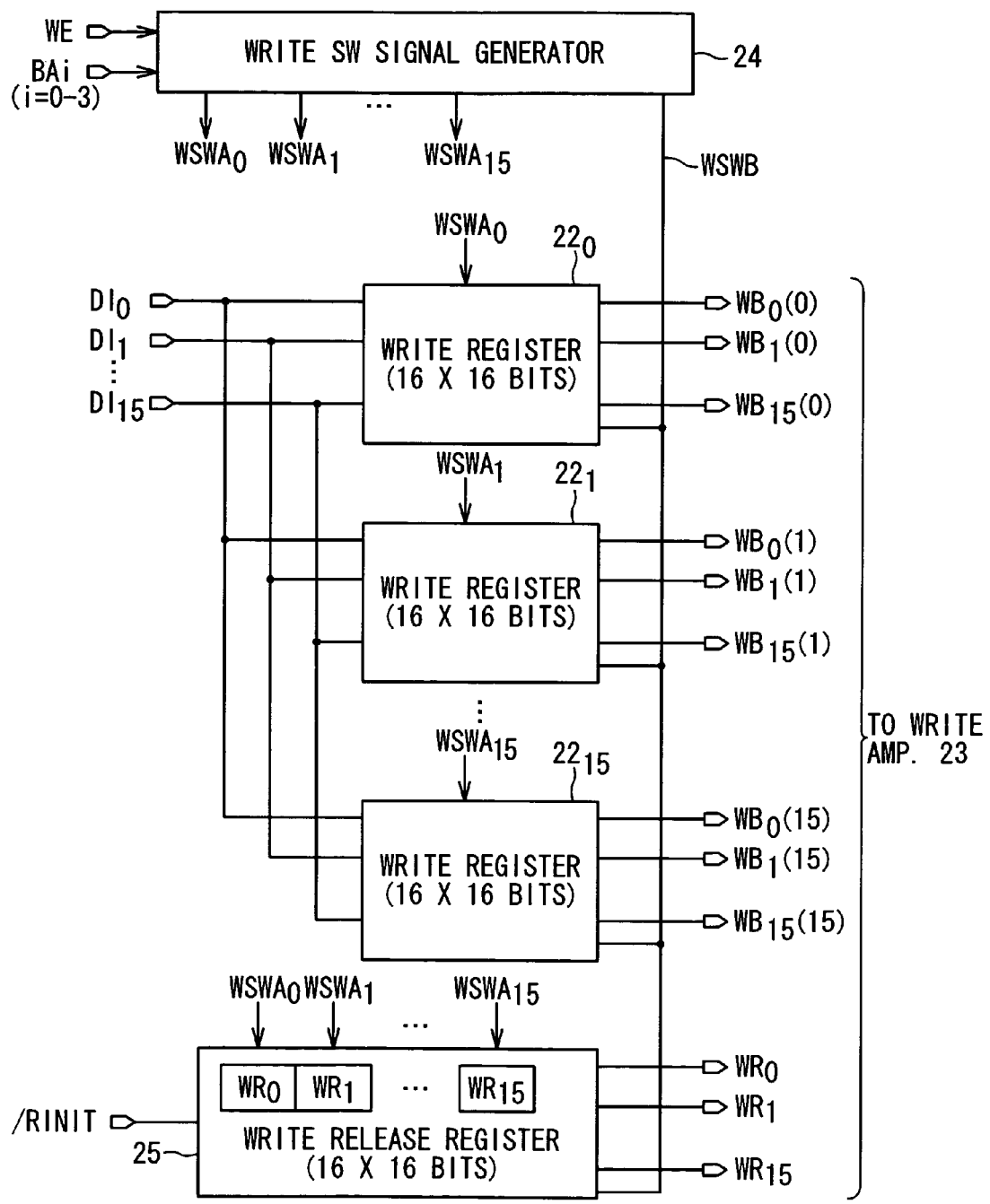
FIG. 2 is a block diagram partially illustrating a structure of a write circuitry integrated within the semiconductor memory device shown in FIG. 1.

Referring to FIG. 2, the write registers $22_0$-$22_{15}$ temporary stores the write data $DI_0$-$DI_{15}$ received from the data input buffer 21, and forwards the received write data $DI_0$-$DI_{15}$ to the write amplifier 23. Each write register 22 has a capacity of 16 bits, enough to store the write data from the data pins $DQ_0$-$DQ_{15}$. The write registers 22 as a whole, therefore, provide a capacity enough to store 16×16-bit data which is the maximum data amount inputted for each burst. Each write register 22 is designed to output the 16-bit write data stored therein in parallel. This implies that the write registers 22 as a whole provide concurrent data write of the 256 data bits stored therein. This effectively reduces the write access time to the memory array 11. The 16-bit write data outputted from the write register $22_k$ are denoted by the symbols $WB_0(k)$-$WB_{15}(k)$, wherein the data bit $WB_j(k)$ is associated with the data pin $DQ_j$.

Referring back to FIG. 1, the write amplifier 23 forwards the 256-bit write data received from the write registers 22 to the sense amplifier 14 to write the write data into the memory array 11. The write amplifier 23 is enabled or disenabled in response to the write amplifier enable signal WAE.

The write switch signal generator 24 generates a set of control signals for controlling the write registers 2 in response to the write enable signal WE and the burst address signals $BA_i$ received from the control circuitry 3. Referring to FIG. 2, the control signals generated by the write switch signal generator 24 include a set of write switch address signal $WSWA_0$-$WSWA_{15}$, and a write switch signal WSWB. The write switch address signal $WSWA_0$-$WSWA_{15}$ are used to select the write registers 22 to be accessed; the write register $22_k$ is enabled to latch the write data $DI_0$-$DI_{15}$ in response to the activation of the associated write switch address signal $WSWA_k$. The write switch signal WSWB, on the other hand, indicates the write registers 22 to forward the write data stored therein to the write amplifier 23. In response to the activation of the write switch signal WSW, the write registers 22 concurrently forward the write data stored therein to the write amplifier 23.

The activation of the write switch address signals $WSWA_0$-$WSWA_{15}$ (that is, the selection of the write registers 22) depends on the burst address indicated by the burst address signals $BA_i$. When the burst address is indicated to be <k>, the write register $22_k$ is selected. This implies that the write register $22_k$ is used to store the write data associated with the burst address <k>.

The write release register 25 is a 16-bit register storing a set of write release flags $WR_0$-$WR_{15}$ which indicate the write register(s) 22 storing the write data during the relevant burst. The write release flag $WR_k$ is asserted in response to the activation of the write switch address signal $WSWA_k$. This results in that the write release flags $WR_0$-$WR_{15}$ are asserted in response to the data write to the associated write registers 22. In other words, the write release flag $WR_k$ is asserted by the write switch signal generator 24, when the write data is written into the associated write register $22_k$. It should be noted that the number of the write release flags $WR_0$-$WR_{15}$ is identical to the maximum burst length.

The write release register 25 is responsive to the register initialize signal /RINT received from the control circuitry 3 to initialize the write release register 25; all the write release flags $WR_0$-$WR_{15}$ are negated in response to the activation of the register initialize signal /RINT.

Figure 3:
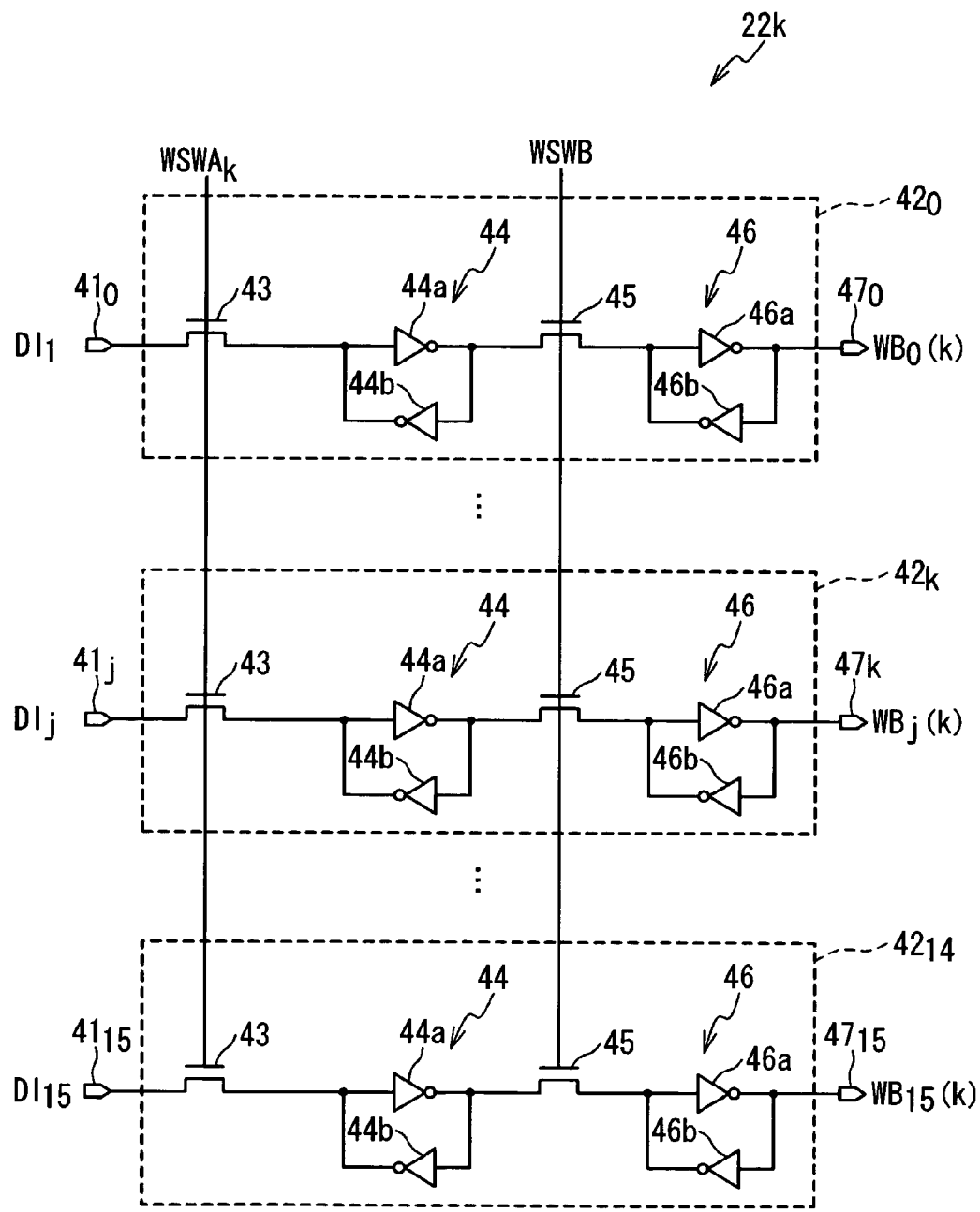
FIG. 3 is a circuit diagram illustrating a structure of write registers integrated within the semiconductor memory device shown in FIG. 1.

FIG. 3 is a circuit diagram illustrating the detailed structure of the write register $22_k$. Each write register $22_k$ is composed of a set of input terminals $41_0$-$41_{15}$ receiving the write data $DI_0$-$DI_{15}$, respectively, and a set of latch circuits $42_0$-$42_{15}$ connected to the input terminals $41_0$-$41_{15}$, respectively. The latch circuits 42 each include an NMOS transistor 43, a master latch 44, an NMOS transistor 45, and a slave latch 46. The master latches 44 each include a pair of inverters 44a and 44b, the input of each being connected the output of the other. Correspondingly, the slave latches 46 each include a pair of inverters 46a and 46b, the input of each being connected to the output of the other. The outputs of the slave latches 46 are connected to output terminals $47_0$-$47_{15}$ through which the write data $WB_0(k)$-$WB_{15}(k)$ are outputted.

Each write register $22_k$ operates as follows. When the write switch address signals $WSWA_k$ and the write switch signal WSWB are initially deactivated, the master latches 44 are disconnected from the input of the write register $22_k$, and the slave latches 46 are disconnected from the master latches 44. In response to the activation of the write switch address signal $WSWA_k$, the write data $DI_0$-$DI_{15}$ are latched into the master latches 46 within the latch circuit $42_0$-$42_{15}$, respectively. When the write switch signal WSWB is then activated, the data bits stored in the master latches 44 are forwarded to the associated slave latches 46. This results in that the outputs of the write register $22_k$ are fixed to the write data $DI_0$-$DI_{15}$, and the write data $DI_0$-$DI_{15}$ stored in the write register $22_k$ are forwarded as the write data $WB_0(k)$-$WB_{15}(k)$ to the write amplifier 23.

Figure 4:
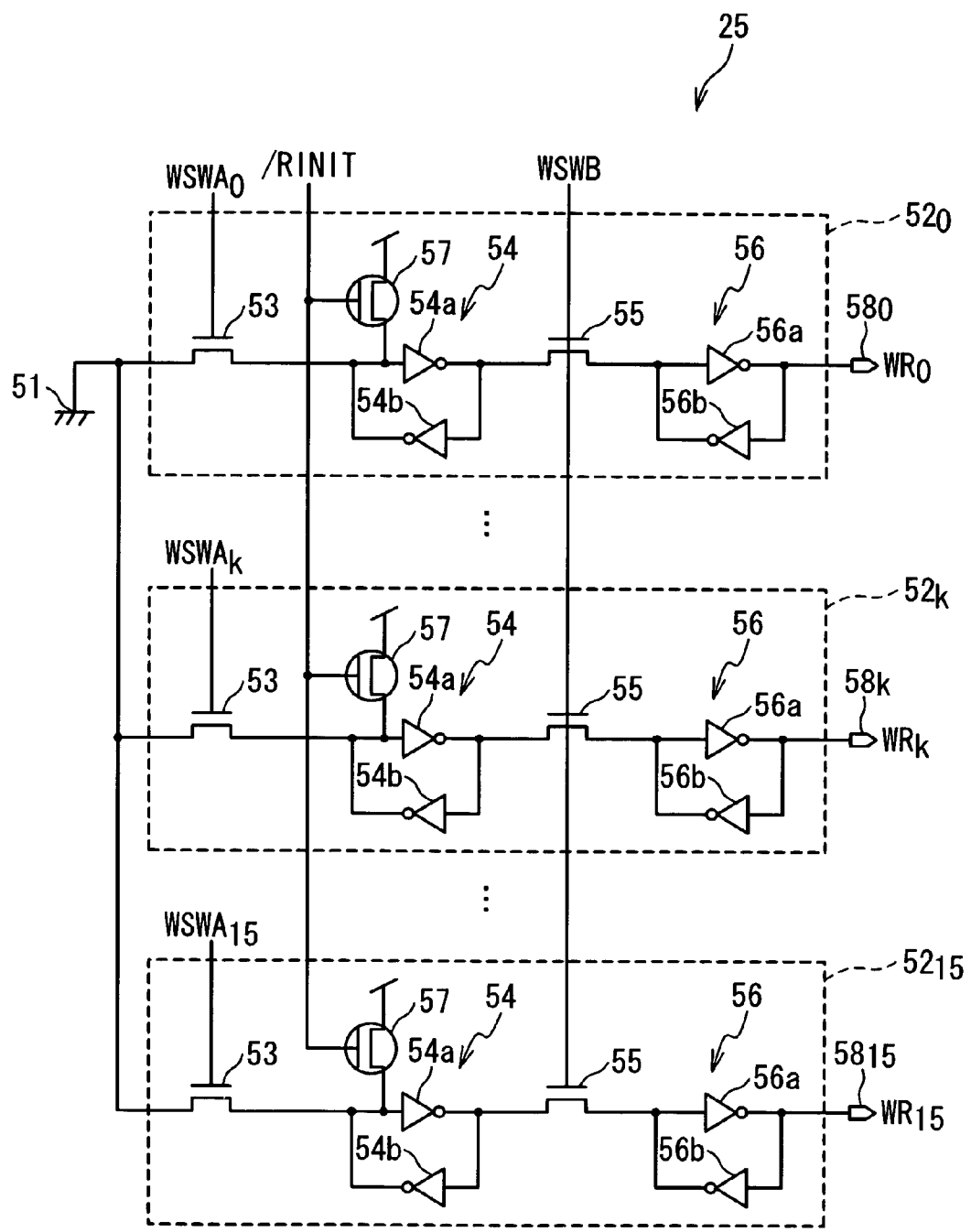
FIG. 4 is a circuit diagram illustrating a structure of a write release register integrated within the semiconductor memory device shown in FIG. 1.

FIG. 4 is a circuit diagram illustrating the structure of the write release register 25. The write release register 25 includes an earth terminal 51, a set of 16 latch circuits $52_0$-$52_{15}$ storing the write release flags $WR_0$-$WR_{15}$, respectively. The latch circuits 52 each include an NMOS transistor 53, a master latch 54, an NMOS transistor 55, a slave latch 56, and a PMOS transistor 57. The master latches 54 each include a pair of inverters 54a, 54b, the input of each being connected to the output of the other. Correspondingly, the slave latches 56 each include a pair of inverters 56a, 56b, the input of each being connected to the output of the other. The outputs of the slave latches 56 are connected to the output terminals $58_0$-$58_{15}$, respectively, through which the write release flags $WR_0$-$WR_{15}$ are outputted.

The write release register 25 operates as follows. When all the latch circuits 52 are initially negated with the write switch address signals $WSWA_k$ and the write switch signal WSWB deactivated, the slave latches 56 are disconnected from the master latches 54.

In response to the activation of the write switch address signal $WSWA_0$, the NMOS transistor 53 within the latch circuit $52_0$ is turned on to provide a connection between the earth terminal 51 to the relevant master latch 54. This results in that the master latch 54 within the latch circuit $52_0$, that is, the write release flag $WR_0$ is asserted. The same goes for the other write switch address signals. In response to the activation of the write switch address signal $WSWA_k$, the master latch 54 within the latch circuit $52_k$, that is, the write release flag $WR_k$ is asserted.

When the write switch signal WSWB is then activated, the master latches 54 are connected with the slave latches 56 within the latch circuits 52. This results in that the latch circuits 52 start to output the write release flags $WR_0$-$WR_{15}$ from the slave latches 56. The write release flags $WR_0$-$WR_{15}$ are provided to the write amplifier 23 to achieve selective data write of the write data $WB_j(k)$.

(Read Circuitry Structure)

Referring back to FIG. 1, the read circuitry 1 is composed of a data amplifier 26, a set of read registers 27, a read switch signal generator 28, and a data output buffer 29.

The data amplifier 26 is designed to concurrently obtain 256-bit read data from the memory array 11 for each burst cycle, and to forward the obtained read data to the read registers 27. The data bit of the obtained read data associated with the data pin $DQ_j$, and the burst address <k> is denoted by a numeral $RB_j(k)$, hereinafter.

Figure 5:
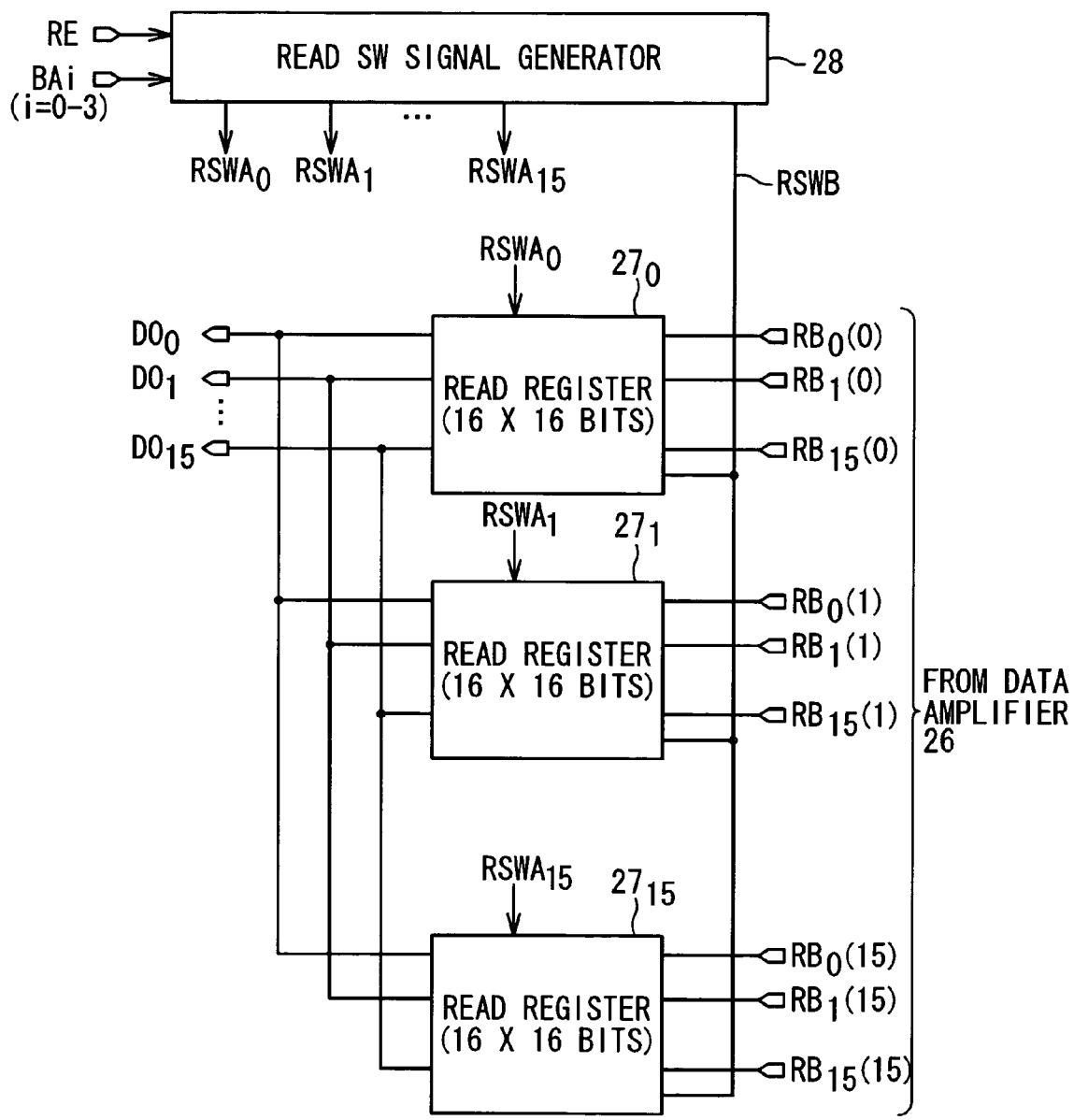
FIG. 5 is a block diagram partially illustrating a structure of a read circuitry integrated within the semiconductor memory device shown in FIG. 1.

The read registers 27 are designed to temporary store the read data concurrently received from the data amplifier 26, and to sequentially forward the received read data to the data output buffer 29. As illustrated in FIG. 5, the number of the read registers 27 is 16, being identical to the maximum burst length. The read register $27_k$ is a 16-bit register receiving the read data bits $RB_0(k)$-$RB_{15}(k)$ from the data amplifier 26. The read data transferred from the read registers 27 to the data output buffer 29 are denoted by symbols $DO_0$-$DO_{15}$, hereinafter.

The read switch signal generator 28 controls the read registers 27 in response to the read enable signal RE and the burst address signals $BA_i$, received from the control circuitry 3. Referring to FIG. 5, the control signals generated by the read switch signal generator 28 include a set of read switch address signals $RSWA_0$-$RSWA_{15}$, and a read signal RSWB. The read switch address signal $RSWA_0$-$RSWA_{15}$ are used to select the read registers 27 to be accessed; the read register $27_k$ is enabled in response to the activation of the associated read switch address signal $RSWA_k$. The read switch signal RSWB, on the other hand, indicates the read registers 27 to forward the read data stored therein to the data output buffer 29. In response to the activation of the read switch signal WSWB, the read register(s) 27 enabled by the read switch address signal $RSWA_k$ outputs the read data $DO_0$-$DO_{15}$ stored therein.

The data output buffer 29 receives the read data $DO_0$-$DO_{15}$, and outputs the received read data $DO_0$-$DO_{15}$ onto the data pins $DQ_0$-$DQ_{15}$ in synchronization with the internal clock signal ICLK. The data input buffer 21 is enabled or disenabled in response to the chip enable signal /CE, and an externally-provided output enable signal /OE.

(Control Circuitry Structure)

Figure 6:
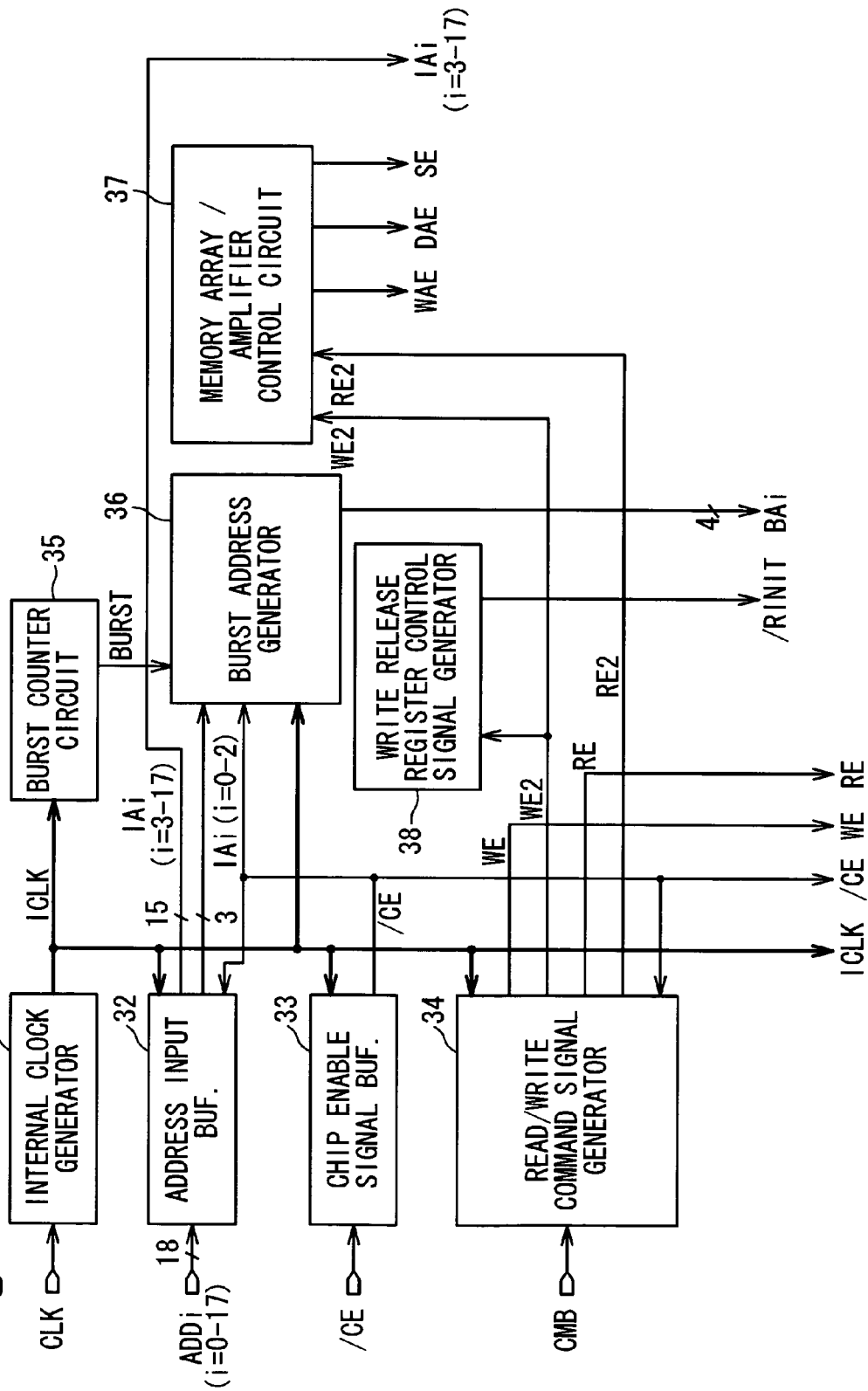
FIG. 6 is a block diagram illustrating a structure of a control circuitry integrated within the semiconductor memory device shown in FIG. 1.

FIG. 6 is a block diagram illustrating the structure of the control circuitry 3. The control circuitry 3 is composed of an internal clock generator 31, an address input buffer 32, a chip enable signal buffer 33, a read/write command signal generator 34, a burst counter circuit 35, a burst address generator 36, a memory array/amplifier control circuit 37, and a write release register control signal generator 38. Schematically, the structure and function of the control circuitry 3 is similar to those of a control circuitry within a widely-used pseudo SRAM, with exception that the control circuitry 3 includes a write release register control signal generator 38.

The internal clock generator 31 generates the internal clock signal ICLK from the external clock signal CLK.

The address input buffer 32 receives the external address signals $ADD_0$-$ADD_{17}$ in synchronization with the internal clock signal ICLK to develop the internal address signals $IA_0$-$IA_{17}$.

The chip enable signal buffer receives the externally-inputted chip enable signal /CE to provide the chip enable signal /CE for desired circuitries within the pseudo SRAM 10.

The read/write command signal generator 34 develops the write enable signal WE and the read enable signal RE in response to the command signal CMD, and the chip enable signal /CE. When the command signal CMD indicates the issue of the write command, the read/write command signal generator 34 activates the write enable signal WE. When the command signal CMD indicates the issue of the read command, on the other hand, the read/write command signal generator 34 activates the read enable signal RE.

The read/write command signal generator 34 is designed to additionally develop a write enable signal WE2 and a read enable signal RE2. The write enable signal WE2 is used to allow the data write operation of the write data stored in the write registers 22 into the memory array 11. The read enable signal RE2, on the other hand, is used to allow the data transfer from the memory array 11 to the read registers 27.

The burst counter circuit 35 is responsive to the internal clock signal ICLK to develop a burst signal BURST indicating whether each clock cycle is relevant to burst transmission. More specifically, the burst counter circuit 35 counts the internal clock signals ICLK over clock cycles corresponding to a predetermined latency after a write cycle or a read cycle is initiated. After the clock cycles corresponding to the predetermined latency have elapsed, the burst counter circuit 35 activates the burst signal BURST.

The burst address generator 36 generates the burst address signals $BA_i$ to identify the burst address, in response to the chip enable signal /CE, the internal address signal $IA_0$-$IA_2$, the burst signal BURST, and the internal clock signal ICLKD.

Specifically, the burst address generator 36 obtains the initial burst address from the internal address signal $IA_0$-$IA_2$ in response to the chip enable signal /CE being activated. The burst address generator 36 then increments the burst address synchronously with the internal clock signal ICLK. The burst address generator 36 provides the burst address thus identified for the write switch signal generator 24 and the read switch signal generator 28, using the burst address signals $BA_i$.

The memory array/amplifier control circuit 37 develops the write amplifier enable signal WAE, the data amplifier enable signal DAE, and the sense amplifier enable signal SE, in response to the write enable signal WE2, and the read enable signal RE2. Referring back to FIG. 1, the write amplifier enable signal WAE and the data amplifier enable signal DAE are used to enable the write amplifier 23 and the data amplifier 26, respectively, while the sense amplifier enable signal SE is used to enable the sense amplifier 14.

The write release register control signal generator 38, which is specific to the pseudo SRAM 10 in this embodiment, develops the register initialize signal /RINIT in response to the write enable signal WE2. As described before, the register initialize signal /RINIT indicates the initialization of the write release register 25.

(Burst Write Operation)

In order to achieve selective data write of the write data, the pseudo SRAM 10 is designed to allow abortion of the burst write operation in the middle of the burst cycle. When the burst write operation is aborted, the pseudo SRAM 10 operates to write the write data transferred to the write register(s) 22 before the abortion of the write operation. This allows the pseudo SRAM 10 to selectively write the desired portion of the series of the write data transmitted during the relevant burst cycle. In this embodiment, the write operation in the middle of the burst cycle is aborted in response to the deactivation of the chip enable signal /CE in the middle of the burst cycle.

The write release flags $WR_0$-$WR_{15}$, stored in the write release register 25, are used to achieve such operation. The write amplifier 23 identifies the write register(s) 22 into which the write data is written before the abortion of the burst cycle, from the write release flags $WR_0$-$WR_{15}$, and selectively writes the write data stored in the relevant write register(s) 22 into the memory array 11. This procedure effectively achieves selective data write of the write data. A detailed description is made of the write operation of the pseudo SRAM 10 in the following.

Figure 7:
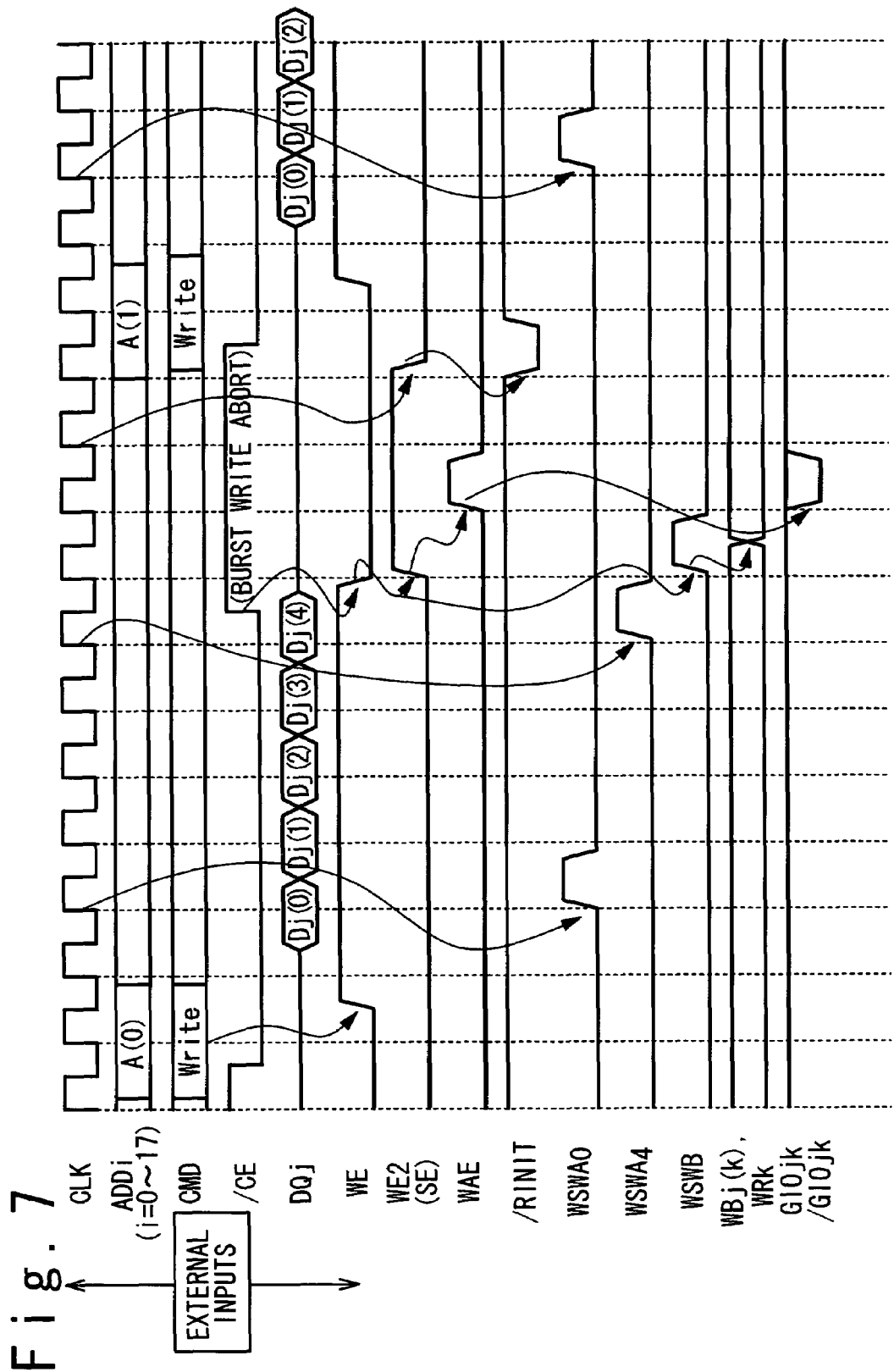
FIG. 7 is a timing chart illustrating an exemplary write operation of the pseudo SRAM shown in FIG. 1.

FIG. 7 is a timing chart illustrating an exemplary write operation of the pseudo SRAM 10 in this embodiment.

Initially, the write release register 25 is initialized to negate all the write release flags $WR_0$-$WR_{15}$.

A write cycle is initiated in response to the issue of a write command. Specifically, the read/write command signal generator 23 issues a write command, when a write operation is requested by the command signal CMD with the chip enable signal /CE enabled. In response to the issue of the write command, the write enable signal WE is activated.

A burst cycle is initiated after the predetermined number of clock cycles corresponding to the predetermined latency have elapsed after the initiation of the write cycle. The latency is three clock cycles in this embodiment. The initiation of the burst cycle is followed by sequentially inputting write data $D_j(0), D_j(1) \ldots$ into the data pin $DQ_j$. It should be noted that the write data $D_j(k)$ refers to the write data inputted to the data pin $DQ_j$ at the k-th clock cycle within the burst cycle.

A series of burst addresses <0>, <1> . . . are sequentially generated in synchronization with the input of the write data $D_j(0), D_j(1) \ldots$, upon the initiation of the burst cycle. The write switch address signals $WSWA_0$, $WSWA_1$ . . . are sequentially activated in response to the generation of the burst addresses <0>, <1> . . . , respectively. This achieves writing the write data $D_j(0), D_j(1) \ldots$ into the write register $22_0, 22_1, \ldots$, respectively. In response to the activation of the write switch address signals $WSWA_0$, $WSWA_1$ . . . , the write release flags $WR_0$, $WR_1$ . . . are sequentially asserted.

The burst cycle is aborted in response to the deactivation of the chip enable signal /CE. In the operation shown in FIG. 7, the burst cycle is aborted after the write data $D_j(4)$ is written into the write register $22_4$. Before the abortion of the burst cycle, the write data $D_j(0)$ to $D_j(4)$ are written into the write registers $22_0$ to $22_4$, and the write release flags $WR_0$ to $WR_4$, associated with the write registers $22_0$ to $22_4$, are asserted. This results in that the write release flags $WR_5$ to $WR_{15}$ remain negated.

After the burst cycle is aborted, the write data that are already written to the associated write registers 22 (that it, the write data stored in the write registers $22_0$ to $22_4$) are selectively written into the memory array 11; the data contained in the write registers $22_5$ to $22_{15}$ are not written into the memory array 11. The selective data write operation thus described is achieved through the following procedure: In response to the deactivation of the chip enable signal /CE, the read/write command signal generator 34 deactivates the write enable signal WE, and activates the write enable signal WE2. In response to the activation of the write enable signal WE2, the sense amplifier enable signal SE is activated by the memory array/amplifier control circuit 37, and the write switch signal WSWB is activated by the write switch signal generator 24. In response to the activation of the write switch signal WSWB, the data $WB_j(0)$-$WB_j(15)$ stored in all the write registers $22_0$-$22_{15}$ are outputted to the write amplifier 23. In the meantime, the write release flags $WR_0$-$WR_{15}$ are outputted to the write amplifier 23. This is followed by activating the write amplifier enable signal WAE in response to the write enable signal WE2. In response to the write enable signal WAE, the write amplifier 23 selectively writes the data stored in the write registers associated with the activated write release flags, into the memory array 11.

In the operation shown in FIG. 7, the write data stored in the write registers $22_0$ to $22_4$ are selectively written into the memory array 11, in response to the write release flag $WR_0$ to $WR_4$ being asserted. The relevant write data are concurrently written into the memory array 11; the access to the memory array 11 is implemented in a single clock cycle. This is important for reducing the write access time.

At the end of the write cycle, the write enable signal WE2 is deactivated. In response to the deactivation of the write enable signal WE2, the register initialize signal /RINIT is activated to negate the write release flags $WR_0$-$WR_{15}$. This achieves the initialization of the write release registers 25 to prepare for the next write cycle.

As thus described, the pseudo SRAM 10 in this embodiment is adapted to the abortion of the burst cycle, and to achieve selectively writing desired data within the relevant burst, without a data mask signal DQM.

It should be noted that the write release flags $WR_0$-$WR_{15}$ are required to be negated at the beginning of the burst cycle. In an alternative embodiment, the write release flags $WR_0$-$WR_{15}$ may be negated at the beginning of the write cycle, instead of the end of the write cycle.

Figure 8:
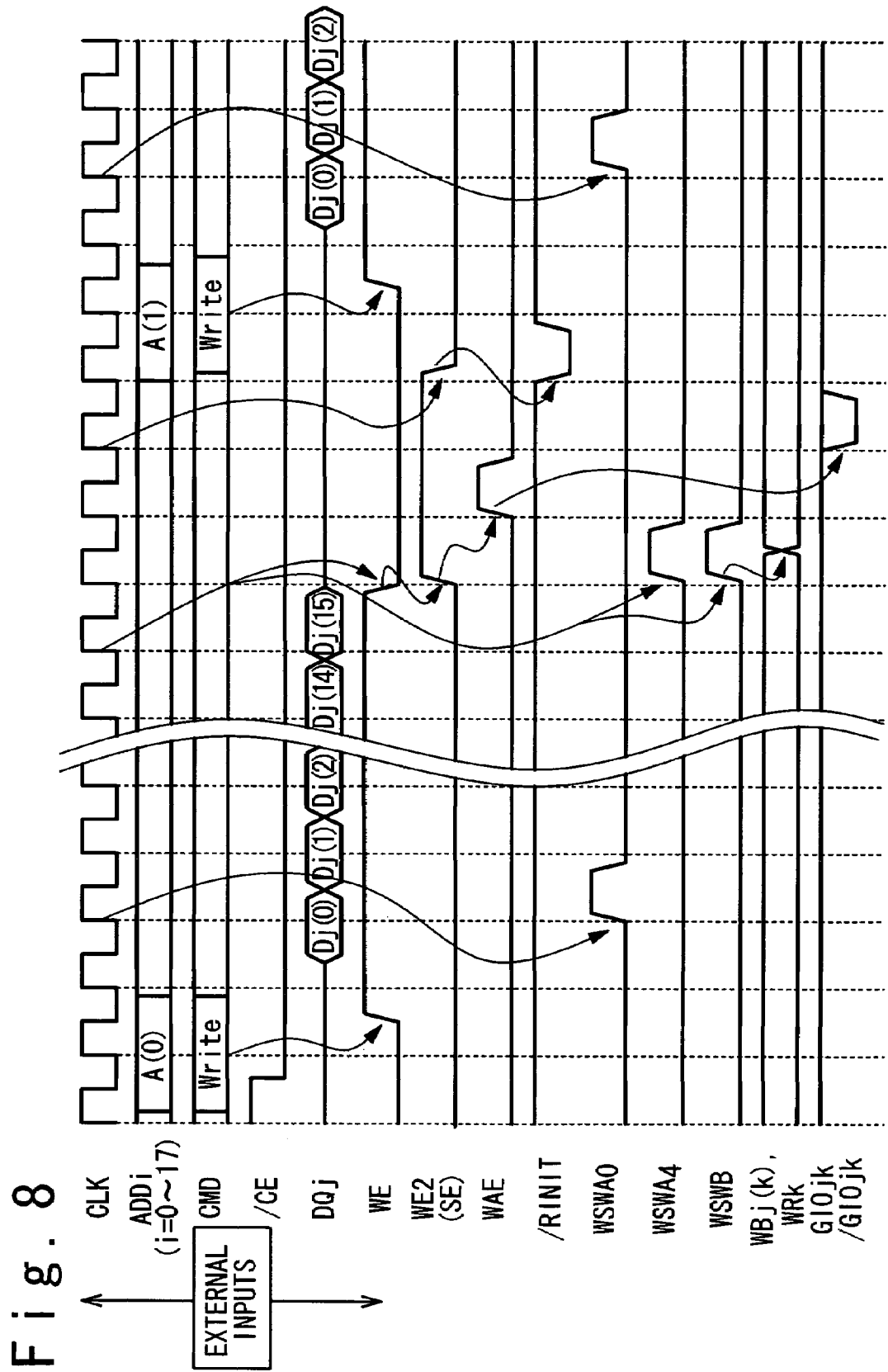
FIG. 8 is another timing chart illustrating an exemplary write operation of the pseudo SRAM shown in FIG. 1.

FIG. 8 is a timing chart illustrating an exemplary write operation of the pseudo SRAM 10 in a case that the burst cycle is not aborted. In this case, the write switch signal WSWB is activated, after the write data $D_j(0)$-$D_j(15)$ are completely written into the write registers $22_0$-$22_{15}$. It should be noted that this operation is accompanied by asserting all the write release flags $WR_0$-$WR_{15}$. In response to the activation of the write switch signal WSWB, the data $WB_j(0)$ stored in all the write registers 22 are outputted to the write amplifier 23, and the write release flags $WR_0$-$WR_{15}$ are forwarded to the write amplifier 23. In response to all the write release flags $WR_0$-$WR_{15}$ being asserted, the write amplifier 23 operates to write the data stored in all the write registers $22_0$-$22_{15}$, that is, the write data $D_j(0)$-$D_j(15)$, into the memory array 11.

(Burst Read Operation)

Figure 9:
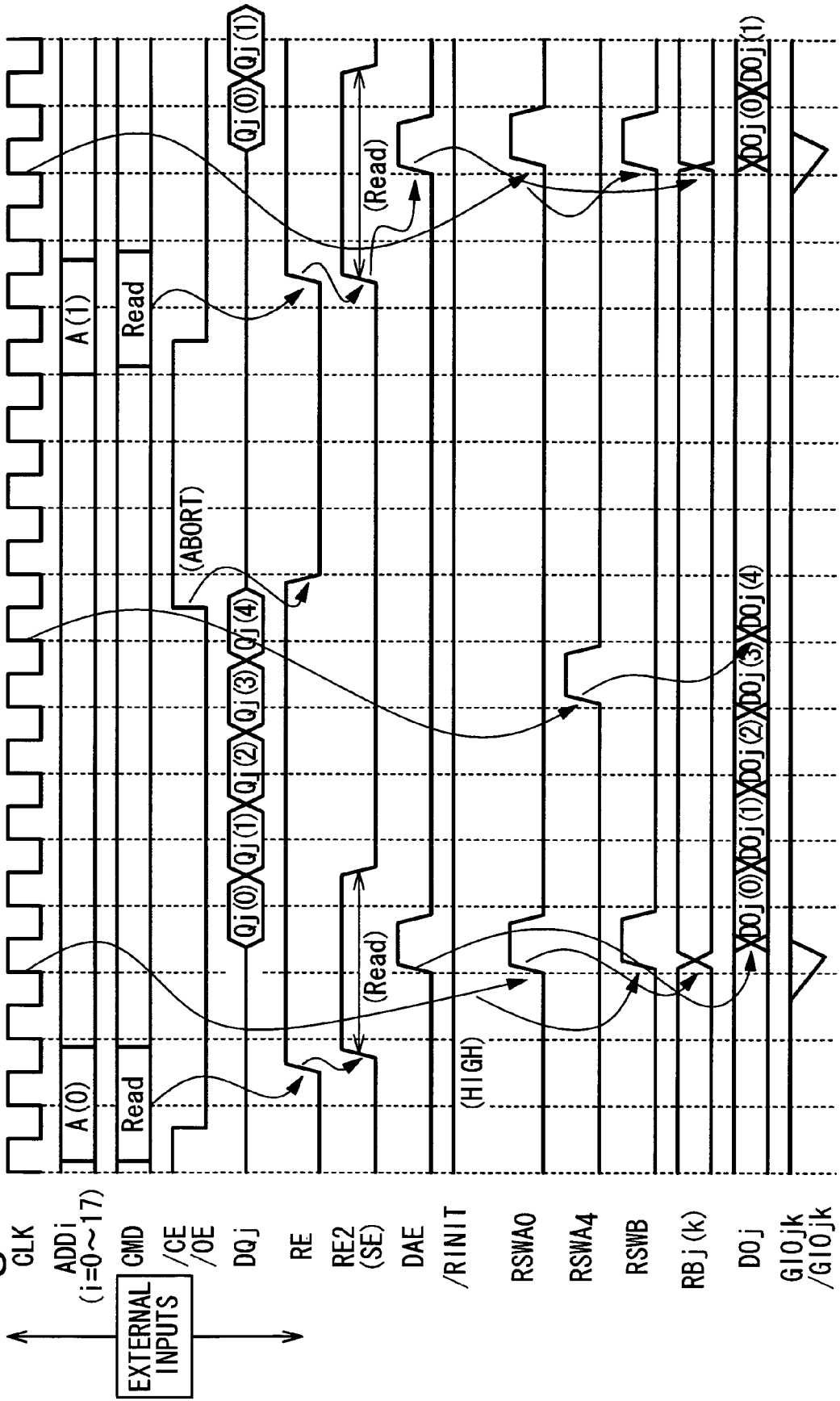
FIG. 9 is a timing chart illustrating an exemplary read operation of the pseudo SRAM shown in FIG. 1.

FIG. 9 is a timing chart illustrating an exemplary read operation of the pseudo SRAM 10 in this embodiment.

A read cycle is initiated in response to the issue of a read command. Specifically, the read/write command signal generator 23 issues a read command, when a read operation is requested by the command signal CMD with the chip enable signal /CE and the output enable signal /OE being enabled. In response to the issue of the read command, the read enable signals RE and RE2 are activated.

After the activation of the read enable signal RE2, the data amplifier enable signal DAE is activated by the memory array/amplifier control circuit 37, and thereby the read data relevant to the burst read operation are concurrently obtained from the memory array 11 to the read registers 27.

A burst cycle is initiated after the predetermined number of clock cycles corresponding to the predetermined latency have elapsed after the initiation of the read cycle. The latency is determined so that the burst cycle is initiated after the data transfer from the memory array 11 to the read registers 27 is completed.

Upon the initiation of the burst cycle, a series of burst addresses <0>, <1> . . . are sequentially generated, while the read switch address signals $RSWA_0$, $RSWA_1$ . . . are sequentially activated. This results in that the read registers $27_0$, $27_1$ . . . are sequentially selected, and the read data $DO_j(0)$, $DO_j(1)$ . . . are sequentially outputted to the data pin $DQ_j$ through the data output buffer 29.

The pseudo SRAM 10 is designed to allow the burst cycle to be aborted in the read operation through deactivating the chip enable signal /CE. In this embodiment, the burst cycle is aborted after the read data $DO_j(4)$ is externally outputted. The read enable signal RE is deactivated in response to the deactivation of the chip enable signal /CE to complete the read cycle.

In summary, the pseudo SRAM 10 in this embodiment is designed to allow the write operation to be aborted in the middle of the burst cycle. In response to the abortion of the write operation being requested, the write amplifier 23 identifies the write register(s) 22 into which the write data is written before the abortion of the burst cycle, and selectively writes the write data stored in the relevant write register(s) 22 into the memory array 11. The write operation thus described allows the pseudo SRAM 10 to selectively write the desired write data stored in the write registers 22 without a data mask signal.

Second Embodiment (Device Structure)

Figure 10:
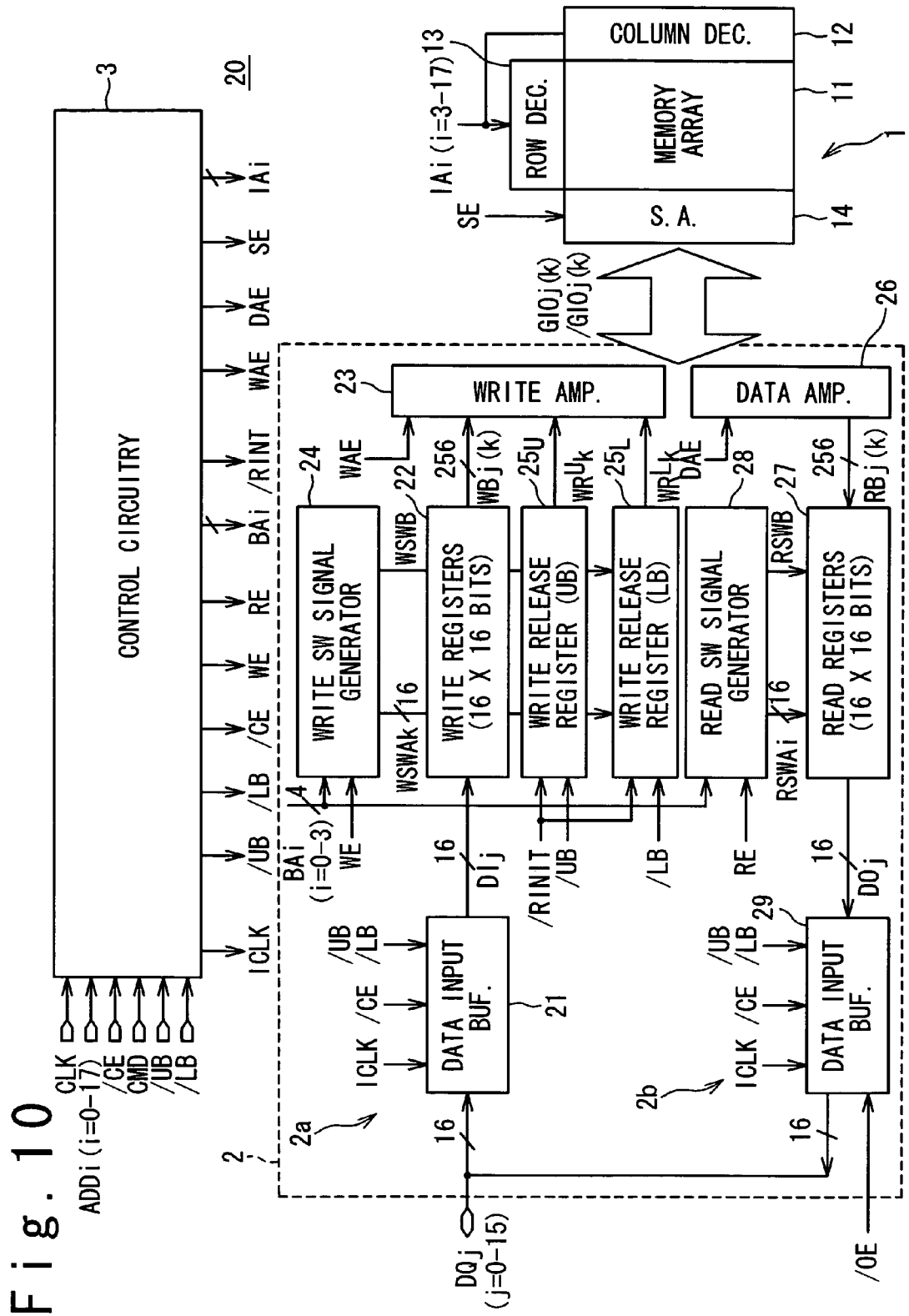
FIG. 10 is a block diagram illustrating a structure of a semiconductor memory device in a second embodiment of the present invention.

FIG. 10 is a block diagram illustrating the structure of the pseudo SRAM 20 in a second embodiment. The structure of the pseudo SRAM 20 in the second embodiment is almost similar to that of the pseudo SRAM 10 shown in FIG. 1; the difference is that the pseudo SRAM 20 is designed to provide individual data access of upper and lower bytes for the memory array 11; the upper bytes designates the bytes associated with the data pins $DQ_8$-$DQ_{15}$, while the lower bytes designates the bytes associated with the data pins $DQ_0$-$DQ_7$. In order to achieve the individual data access of the upper and lower bytes, a set of byte select signals /UB and /LB are externally provided for the pseudo SRAM 20. The upper byte select signal /UB is used to enable the access of the upper bytes, while the lower byte select signal /LB is used to enable the access of the lower bytes. More specifically, the structure of the pseudo SRAM 20 is different from that of the pseudo SRAM 10 shown in FIG. 1 as described in the following.

Figure 11:
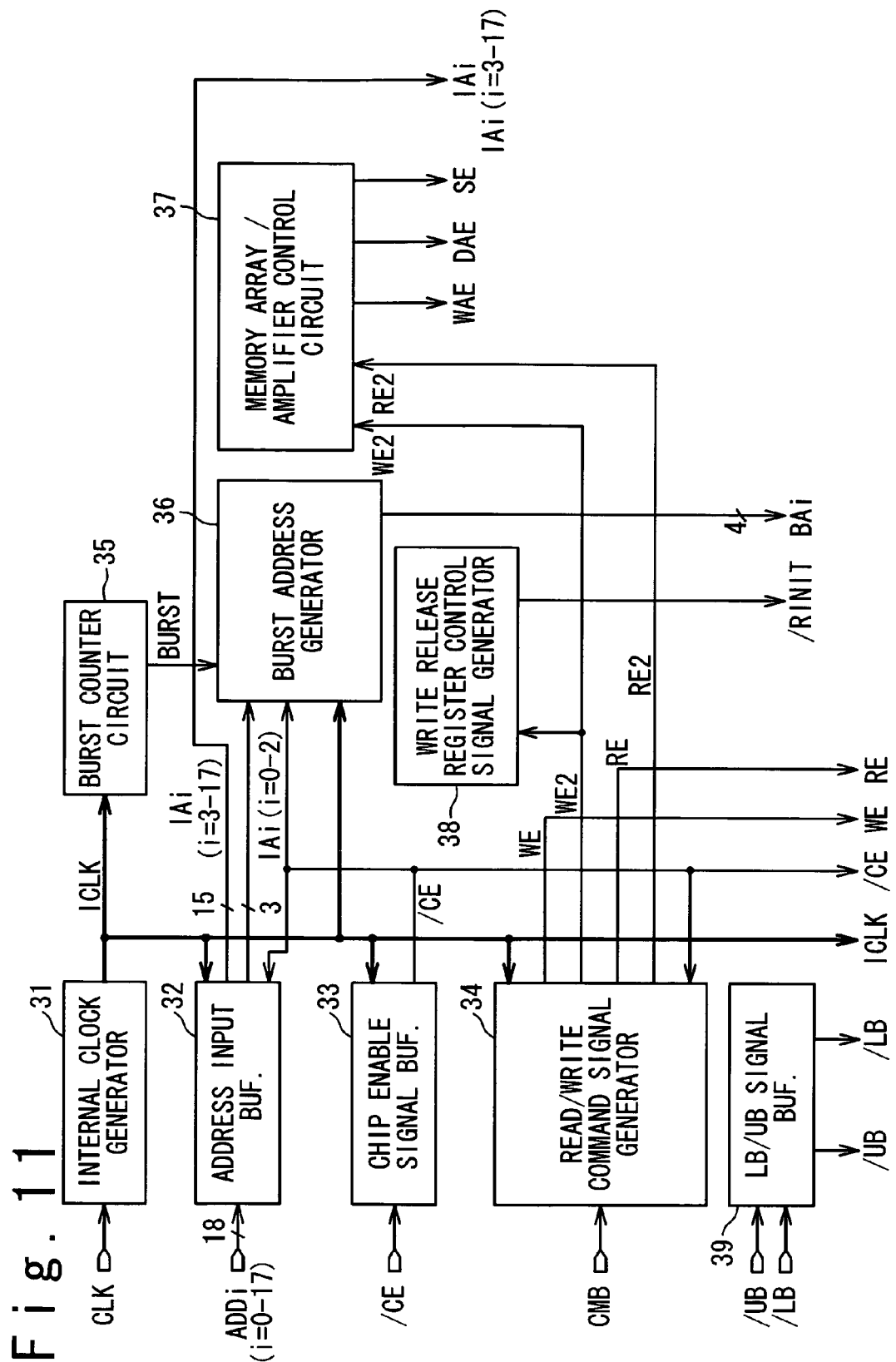
FIG. 11 is a block diagram illustrating a structure of a control circuitry integrated within the semiconductor memory device shown in FIG. 10.

As shown in FIG. 11, the control circuitry 3 within the pseudo SRAM 20 in this embodiment additionally includes an LB/UB signal buffer 39 receiving the byte select signals /UB and /LB. The byte select signals /UB and /LB are delivered to desired circuits within the pseudo SRAM 20 through the LB/UB signal buffer 39.

Figure 12:
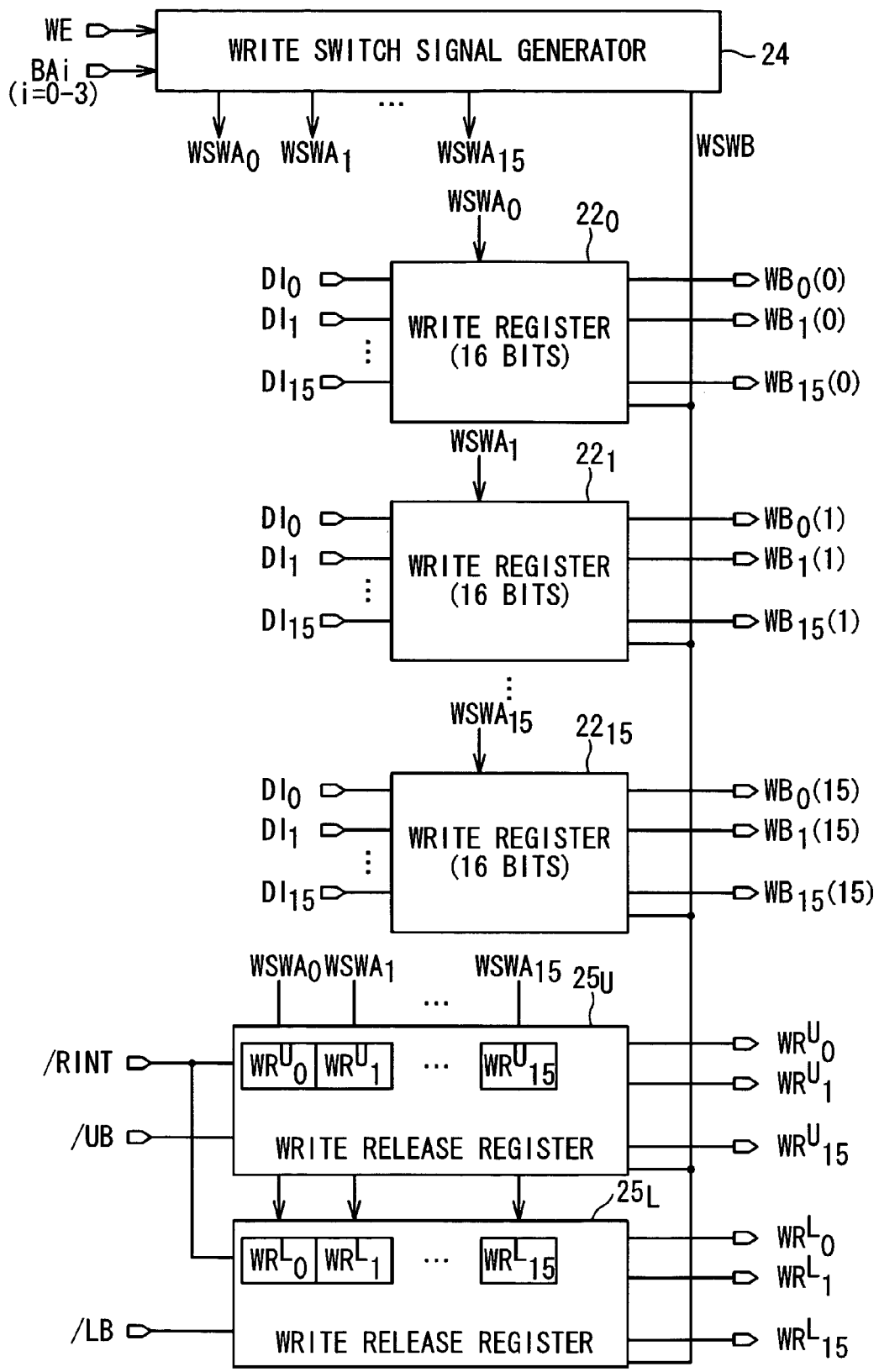
FIG. 12 is a block diagram partially illustrating a structure of a write circuitry integrated within the semiconductor memory device shown in FIG. 10.

Additionally, as shown in FIG. 10, the pseudo SRAM 20 is provided with a pair of write release registers $25_U$ and $25_L$. The write release register $25_U$ is associated with the upper bytes, and the write release register $25_L$ is associated with the lower bytes. Referring to FIG. 12, the write release register $25_U$ is used to store write release flags $WR^U_0$-$WR^U_{15}$ indicating whether the data write is performed onto the upper bytes of the write registers 22; the fact that the write release flag $WR^U_k$ is asserted indicates that the write data is written into the upper byte of the write register $22_k$. Correspondingly, the write release register $25_L$ is used to store write release flags $WR^L_0$-$WR^L_{15}$ indicating whether the data write is performed onto the lower bytes of the write registers 22. The write release register $25_U$ is responsive to the upper byte select signal /UB, and the write release register $25_L$ is responsive to the lower byte select signal /LB.

Figure 13:
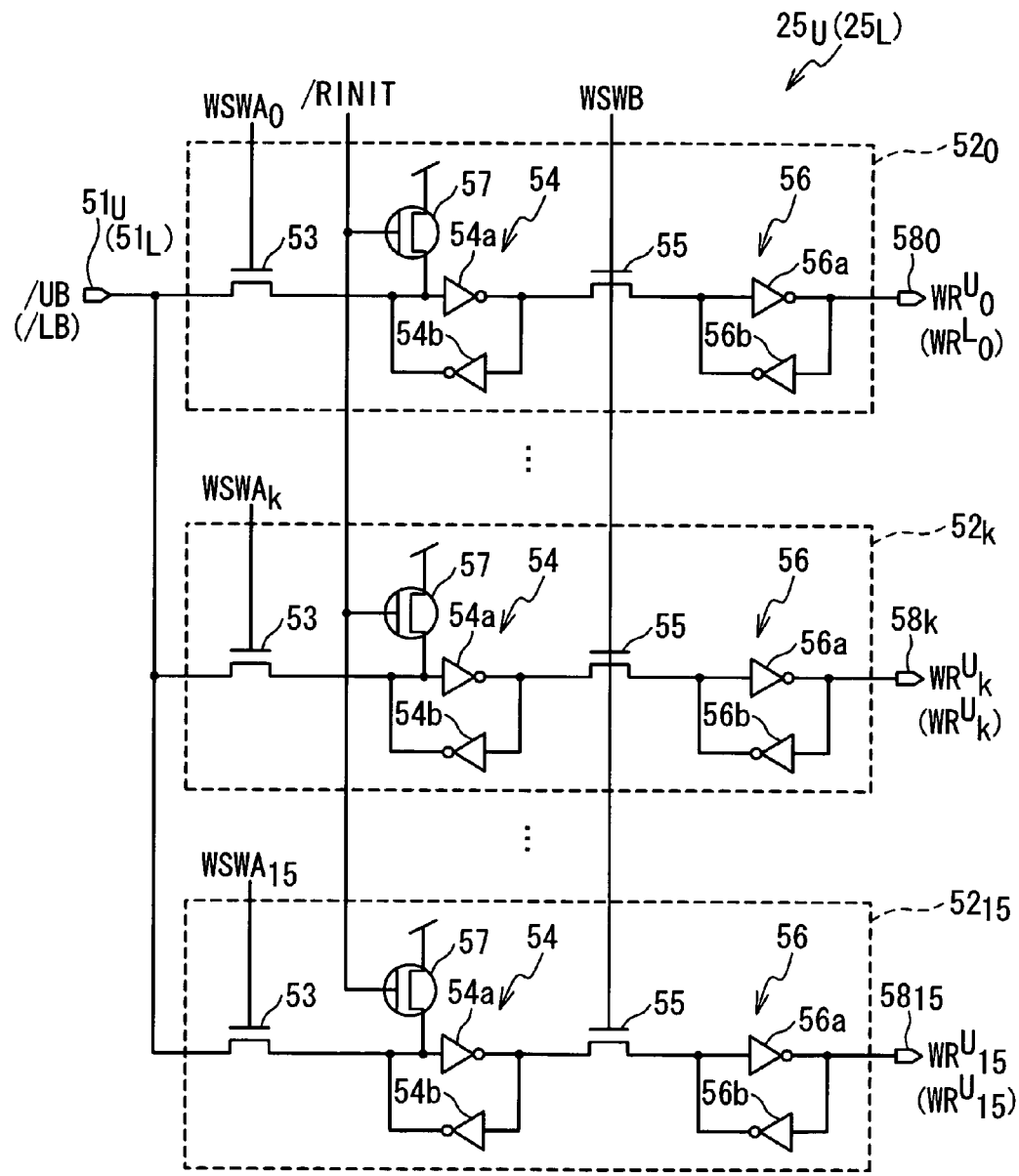
FIG. 13 is a circuit diagram illustrating a structure of a write release register integrated within the semiconductor memory device shown in FIG. 10.

FIG. 13 is a circuit diagram illustrating the structures of the write release registers $25_U$ and $25_L$. The structure of the write release register $25_U$ is almost identical to that of the write release register 25 shown in FIG. 4, except for that the earth terminal 51 is replaced with an input terminal $51_U$ receiving the upper byte select signal /UB. Correspondingly, the structure of the write release register $25_L$ is almost identical to that of the write release register 25 shown in FIG. 4, except for that the earth terminal 51 is replaced with an input terminal $51_L$ receiving the lower byte select signal /LB.

The latch circuit $52_k$ within the write release register $25_U$ is asserted in response to the activation of the write switch address signal $WSWA_k$, only when the upper byte select signal /UB is activated (that is, the upper byte select signal /UB is set to the "Low" level); the write release flags $WR^U_0$-$WR^U_{15}$ are allowed to be asserted, only when the upper byte select signal /UB is activated.

Correspondingly, the latch circuit $52_k$ within the write release register $25_L$ is asserted in response to the activation of the write switch address signal $WSWA_k$, only when the lower byte select signal /LB is activated; the write release flags $WR^L_0$-$WR^L_{15}$ are allowed to be asserted, only when the lower byte select signal /LB is activated.

Referring back to FIG. 10, the data input buffer 21 and the data output buffer 29 within the pseudo SRAM 20 in this embodiment are designed to operate in response to the byte select signals /UB and /LB. The data input buffer 21 enables the upper byte data pins $DQ_8$-$DQ_{15}$ in response to the activation of the upper byte select signal /UB, while enabling the lower byte data pins $DQ_0$-$DQ_7$ in response to the activation of the lower byte select signal /LB. The same goes for the data output buffer 29.

(Burst Write Operation)

FIG. 14 is a timing chart illustrating an exemplary write operation of the pseudo SRAM 20 in this embodiment.

Initially, the write release registers $25_U$ and $25_L$ are initialized; all the write release flags $WR^U_0$-$WR^U_{15}$ and $WR^L_0$-$WR^L_{15}$ are initially negated.

A write cycle is initiated in response to the issue of a write command. Specifically, the read/write command signal generator 23 issues a write command, when a write operation is requested by the command signal CMD with the chip enable signal /CE enabled. In response to the issue of the write command, the write enable signal WE is activated.

In the meantime, desired one(s) of the byte select signals /UB and /LB are activated. The upper byte data pins $DQ_0$-$DQ_{15}$ are enabled, when the upper byte select signal /UB is activated. Correspondingly, the lower byte data pins $DQ_0$-$DQ_7$ are enabled, when the lower byte select signal /LB is activated.

A burst cycle is initiated after the predetermined number of clock cycles corresponding to the predetermined latency have elapsed after the initiation of the write cycle. The initiation of the burst cycle is followed by sequentially inputting write data $D_j(0)$, $D_j(1)$ ... into the data pin $DQ_j$. It should be noted that the write data $D_j(k)$ refers to the write data inputted to the data pin $DQ_j$ at the k-th clock cycle within the burst cycle.

The data input buffer 21 latches selected ones of upper and lower bytes of the write data $D_j(0)$, $D_j(1)$ .... Specifically, the data input buffer 21 latches the upper bytes of the write data $D_j(0)$, $D_j(1)$ ..., when the upper byte select signal /UB is enabled. Correspondingly, the data input buffer 21 latches the lower bytes of the write data $D_j(0)$, $D_j(1)$ ..., when the lower byte select signal /LB is enabled. It should be noted that the data input buffer 21 latches both of upper and lower bytes when both of the byte select signals /UB and /LB are enabled.

A series of burst addresses <0>, <1> ... are sequentially generated in synchronization with the input of the write data $D_j(0)$, $D_j(1)$ ..., upon the initiation of the burst cycle. The write switch address signals $WSWA_0$, $WSWA_1$ ... are sequentially activated in response to the generation of the burst addresses <0>, <1> ..., respectively. This achieves writing the write data $D_j(0)$, $D_j(1)$ ... into the write register $22_0$, $22_1$ ..., respectively. In response to the activation of the write switch address signals $WSWA_0$, $WSWA_1$ ..., the write release flags $WR_0$, $WR_1$ ... are sequentially asserted.

The data write operation of the write data $D_j(0)$, $D_j(1)$ ... into the write register $22_0$, $22_1$ ... is accompanied by asserting the associated write release flags. When the upper byte select signal /UB is activated to enable the upper bytes, the write release flags $WR^U_0$, $WR^U_1$ ... are sequentially asserted in response to the activation of the associated write switch address signals $WSWA_0$, $WSWA_1$ .... Correspondingly, when the lower byte select signal /LB is activated to enable the lower bytes, the write release flags $WR^L_0$, $WR^U_1$ ... are sequentially asserted in response to the activation of the associated write switch address signals $WSWA_0$, $WSWA_1$ .... It should be noted that both of the write release flags $WR^U_0$, $WR^U_1$ ..., and $WR^L_0$, $WR^L_1$ ... may be asserted in response to both of the upper and lower byte select signals /UB and /LB being activated.

The burst cycle is aborted in response to the deactivation of the chip enable signal /CE. In the operation shown in FIG. 14, the burst cycle is aborted after the write data $D_j(4)$ is written into the write register $22_4$. Before the abortion of the burst cycle, the write data $D_j(0)$ to $D_j(4)$ are written into the write registers $22_0$ to $22_4$, and the write release flags $WR^U_0$ to $WR^U_4$ and/or $WR^L_0$ to $WR^L_4$, associated with the write registers $22_0$ to $22_4$, are asserted. This results in that the remaining write release flags remain negated.

After the burst cycle is aborted, the data bytes that are already written to the associated write registers 22 (that it, the data bytes stored in the write registers $22_0$ to $22_4$) are selectively written into the memory array 11; the data bytes contained in the write registers $22_5$ to $22_{15}$ are not written into the memory array 11.

The selective data write operation thus described is achieved through the following procedure: In response to the deactivation of the chip enable signal /CE, the read/write command signal generator 34 deactivates the write enable signal WE, and activates the write enable signal WE2. In response to the activation of the write enable signal WE2, the sense amplifier enable signal SE is activated by the memory array/amplifier control circuit 37, and the write switch signal WSWB is activated by the write switch signal generator 24. In response to the activation of the write switch signal WSWB, the data $WB_j(0)$-$WB_j(15)$ stored in all the write registers $22_0$-$22_{15}$ are outputted to the write amplifier 23. In the meantime, the write release flags $WR^U_0$-$WR^U_{15}$, and $WR^L_0$-$WR^L_{15}$ are outputted to the write amplifier 23. This is followed by activating the write amplifier enable signal WAE in response to the write enable signal WE2. In response to the write enable signal WAE, the write amplifier 23 selectively writes the data bytes stored in the write registers associated with the activated write release flags, into the memory array 11.

More specifically, when the upper bytes are enabled, the write release flags $WR^U_0$ to $WR^U_4$ are enabled, while the release flags $WR^U_5$ to $WR^U_{15}$ remain negated. In response to the write release flags $WR^U_0$ to $WR^U_4$ being enabled, the upper bytes of the write data contained in the write registers $22_0$ to $22_4$ are written into the memory array 11.

Correspondingly, when the upper bytes are enabled, the write release flags $WR^L_0$ to $WR^L_4$ are enabled, while the release flags $WR^L_5$ to $WR^L_{15}$ remain negated. In response to the write release flags $WR^L_0$ to $WR^L_4$ being enabled, the upper bytes of the write data contained in the write registers $22_0$ to $22_4$ are written into the memory array 11.

The relevant data bytes of the write data are concurrently written into the memory array 11; the access to the memory array 11 is implemented in a single clock cycle. This is important for reducing the write access time.

At the end of the write cycle, the write enable signal WE2 is deactivated. In response to the deactivation of the write enable signal WE2, the register initialize signal /RINIT is activated to negate the write release flags $WR^U_0$-$WR^U_{15}$, and $WR^L_0$-$WR^L_{15}$. This achieves the initialization of the write release registers 25 to prepare for the next write cycle.

As thus described, the pseudo SRAM 20 in this embodiment is adapted to the abortion of the burst cycle, and to achieve selectively writing desired data within the relevant burst, without a data mask signal DQM.

Additionally, the pseudo SRAM 20 in this embodiment, incorporating the pair of the write release registers associated with upper and lower bytes, provides individual write access of the upper and lower bytes to the memory array 11.

It is apparent that the present invention is not limited to the above-described embodiments, which may be modified and changed without departing from the scope of the invention.

Especially, it should be noted that, although the above-described embodiments address applying the present invention to the pseudo SRAM, those skilled in the art would appreciate that the present invention is applicable to other semiconductor memory devices; the present invention is advantageously applied to semiconductor memory devices which suffer from reduces access speed to the memory array.

What is claimed is:

1. A semiconductor memory device comprising
a memory array;
a set of write registers;
an input buffer sequentially receiving a series of write data during a burst cycle, and writing said write data into associated ones of said write registers;
a write release register containing a set of write release flags associated with said write registers;
a write release register controller asserting associated ones of said write release flags in response to said write data being written into said associated ones of said write registers;
a write amplifier writing said write data contained in said write registers associated with asserted ones of said write release flags-into said memory array when said burst cycle is aborted in response to a control signal, and
a register initialize signal generator providing a register initialize signal for said write release register,
wherein said write amplifier is designed to write a complete set of said write data contained in all of said write registers when said burst cycle is not aborted,
wherein said set of write release flags are negated when said burst cycle is initiated,
wherein said register initialize signal is activated before said burst cycle is initiated, and
wherein said write release register negates all of said write release flags in response to said register initialize signal being activated.

2. A semiconductor memory device comprising
a memory array;
a set of write registers;
an input buffer sequentially receiving a series of write data during a burst cycle, and writing said write data into associated ones of said write registers;
a write release register containing a set of write release flags associated with said write registers;
a write release register controller asserting associated ones of said write release flags in response to said write data being written into said associated ones of said write registers;
a write amplifier writing said write data contained in said write registers associated with asserted ones of said write release flags-into said memory array when said burst cycle is aborted in response to a control signal; and
a burst address generator generating a burst address,
wherein said write release register controller is responsive to said burst address for selecting said write registers into which said write data are written, and for generating a set of write switch address signals to enable selected ones of said write registers;
wherein said write release register asserts ones of said write release flags associated with said selected ones of said write registers, in response to said set of write switch address signals.

3. A semiconductor memory device comprising:
a memory array;
a set of write registers;
an input buffer designed to sequentially receive a series of write data during a burst cycle, and to write said write data into associated ones of said write registers;
an upper write release register containing a set of upper write release flags associated with said write registers, respectively;
a lower write release register containing a set of lower write release flags associated with said write registers, respectively;
a write release register controller designed to assert associated ones of said upper write release flags in response to upper bytes of said write data being written into said associated ones of said write registers, and to assert associated ones of said lower write release flags in response to lower bytes of said write data being written into said associated ones of said write registers; and
a write amplifier designed to concurrently write said upper bytes of said write data contained in said write registers associated with asserted ones of said upper write release flags, and said lower bytes of said write data contained in said write registers associated with asserted ones of said lower write release flags, selectively, when said burst cycle is aborted in response to a control signal.

* * * * *